United States Patent [19]

Shacter

[11] Patent Number: 5,570,067

[45] Date of Patent: Oct. 29, 1996

[54] MICROPOWER RC OSCILLATOR HAVING HYSTERESIS PRODUCED BY SWITCHING CURRENT SOURCES TO A TRANSISTOR

[75] Inventor: Stuart B. Shacter, Tucson, Ariz.

[73] Assignee: National Semiconductor Corporation, Santa Clara, Calif.

[21] Appl. No.: 469,129

[22] Filed: Jun. 6, 1995

[51] Int. Cl.$^6$ .................................................. H03K 3/354
[52] U.S. Cl. ................................. 331/111; 331/143
[58] Field of Search ...................... 331/111, 143

[56] References Cited

U.S. PATENT DOCUMENTS

| | | | |
|---|---|---|---|
| 4,513,258 | 4/1985 | Jamiolkowski et al. | 331/111 |
| 5,418,502 | 5/1995 | Ma et al. | 331/111 |

OTHER PUBLICATIONS

P. Käkelä, T. Rahkonen, J. Kostamovaara, "A Micropower RC Oscillator Chip for consuver ASIC Applications", ©1991, pp. 278–281. IEEE CH2964-5/91.

*Primary Examiner*—Siegfried H. Grimm
*Attorney, Agent, or Firm*—Skjerven, Morrill, MacPherson, Franklin & Friel; Paul J. Winters; Ken J. Koestner

[57] ABSTRACT

An RC oscillator operates at very low current levels and manifests very brief internal component delays. The RC oscillator does not employ a conventional comparator and a conventional hysteresis circuit for changing reference voltages on the comparator. Instead, the RC oscillator includes a plurality of amplifiers. Hysteresis is achieved by changing the threshold voltage of one of the amplifiers. The threshold voltage is changed by switching different current values through the transistor so that the current for activating the amplifier is different from the current for deactivating the amplifier.

15 Claims, 3 Drawing Sheets

5,570,067

MICROPOWER RC OSCILLATOR HAVING HYSTERESIS PRODUCED BY SWITCHING CURRENT SOURCES TO A TRANSISTOR

FIELD OF INVENTION

This invention relates to the field of oscillator circuits. More specifically, this invention relates to a micropower RC oscillator which operates at subthreshold current levels.

BACKGROUND OF THE INVENTION

Oscillator circuits are used to convert dc power into a periodic waveform or signal. Conventional RC oscillators advantageously furnish a low-cost timing source and allow for generation of variable frequencies by changing the resistance R or capacitance C. Furthermore, conventional RC oscillators advantageously avoid the use of inductors, which are difficult to fabricate on integrated circuits.

Various circuit applications, such as instrumentation and mobile telecommunication applications, specify a very low current drain requirement. In these applications, a micropower RC oscillator is employed. One example of a conventional micropower RC oscillator is described in an article by P. Kakela et at. entitled "A Micropower RC Oscillator Chip for Consumer ASIC Applications", 6th Mediterranean Electrotechnical Conference Proceedings, pp. 278–81, V1; 1991. The Kakela et at. RC oscillator 100 is shown in FIG. 1 and includes a capacitor C and a resistor R, a circuit 110 for charging and discharging the capacitor C, a comparator 120 and a hysteresis circuit 130. The charging and discharging circuit 110 ramps the capacitor voltage up and down. The comparator 120 senses the voltage on the capacitor and the hysteresis circuit 130 changes the reference voltage of the comparator 120 and thereby causing the output voltage to switch state. Unfortunately, the frequency of oscillation of the RC oscillator 100 is significantly affected by the delay time within the comparator 120 and the hysteresis circuit 130 as opposed to a more advantageous situation in which the frequency of oscillation is determined by the R and C component values chosen for the circuit. Furthermore, the RC oscillator 100 operates at a current of approximately 2μA while a much greater reduction is current is sought, for example a current range of approximately 200 nA to 300 nA.

What is needed is an RC oscillator circuit that operates with a very low supply current and operates with very short component delays so that the feedback loop of the oscillator is accelerated.

SUMMARY OF THE INVENTION

In accordance with the present invention, an RC oscillator operates at very low current levels and manifests very brief internal component delays. The disclosed RC oscillator does not employ a conventional comparator and a conventional hysteresis circuit for changing reference voltages on the comparator. Instead, the disclosed RC oscillator includes a plurality of amplifiers. Hysteresis is achieved by changing the threshold voltage of one of the amplifiers. The threshold voltage is changed by switching different current values through the transistor so that a voltage magnitude sufficient to activate the amplifier is different from a voltage magnitude sufficient to deactivate the amplifier.

Also in accordance with the present invention, a CMOS RC oscillator exploits the change in gate to source voltage $\Delta V_{GS}$ of a transistor operating in weak inversion to set hysteresis that determines a voltage excursion on a capacitor C of the RC oscillator. The CMOS RC oscillator operates at subthreshold current levels and at supply voltages down to approximately 1.8 volts.

In accordance with a first embodiment of the invention, an RC oscillator includes an RC circuit with a resistor and a capacitor, a capacitor charging and discharging circuit connected to the capacitor and a transistor connected to the capacitor for sensing the capacitor voltage. The RC oscillator also includes a hysteresis circuit connected to the transistor for receiving a signal indicative of the sensed capacitor voltage and for generating a control signal controlling a threshold voltage of the transistor and connected to the capacitor charging and discharging circuit for controlling charging and discharging of the capacitor.

In accordance with a second embodiment of the invention, an RC oscillator includes a resistor, a capacitor connected to the resistor and a biasing circuit connected to the resistor and connected to the capacitor for supplying a current for charging the capacitor. The RC oscillator also includes a transistor having a control terminal connected the capacitor and an output terminal and a hysteresis circuit having an input terminal connected to the transistor output terminal, a first output control signal generating a signal for controlling charging of the capacitor and a second output control signal generating a signal for controlling a threshold voltage of the transistor.

In accordance with an additional embodiment of the invention, a method of operating an RC oscillator having a resistor and a capacitor includes the steps of alternately charging and discharging the capacitor, sensing the capacitor voltage using a transistor connected to the capacitor, controlling a threshold voltage of the transistor as a function of the sensed capacitor voltage and controlling the charging and discharging of the capacitor as a function of the sensed capacitor voltage. The RC oscillator is operated in a subthreshold condition.

The RC oscillator of the present invention has many advantages. One advantage is that the RC oscillator of the present invention substantially reduces internal component delays so that the oscillation frequency is advantageously dominated by the resistance R and capacitance C values of the components and is not greatly influenced by component delays. A further advantage is that the RC oscillator disclosed herein operates under very low power conditions at very low currents, for example currents in the range of hundreds of nanoamperes (for example, about 200 nA) to generate suitable oscillator frequencies in the range of tens of kilohertz to hundreds of kilohertz (for example, about 8 kHz). An additional advantage is that the RC oscillator utilizes a simplified circuit with fewer circuit components. Furthermore, the oscillator generates a timing signal which is essentially linearly dependent on a resistance R and a capacitance value C. The timing signal is only weakly dependent on process variations.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
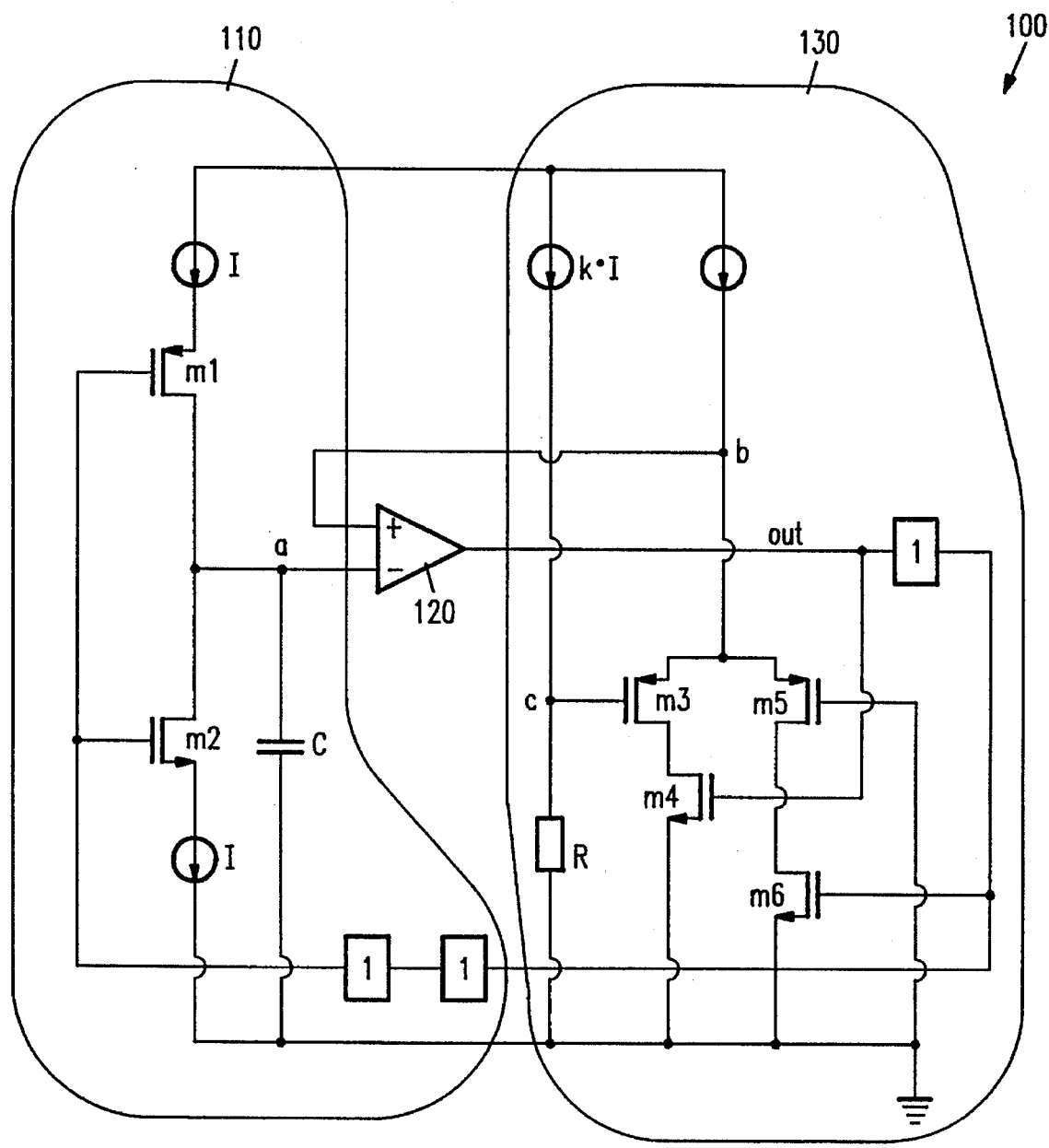
FIG. 1, labelled PRIOR ART, is a schematic circuit diagram of a conventional low power RC oscillator.
Figure 2:
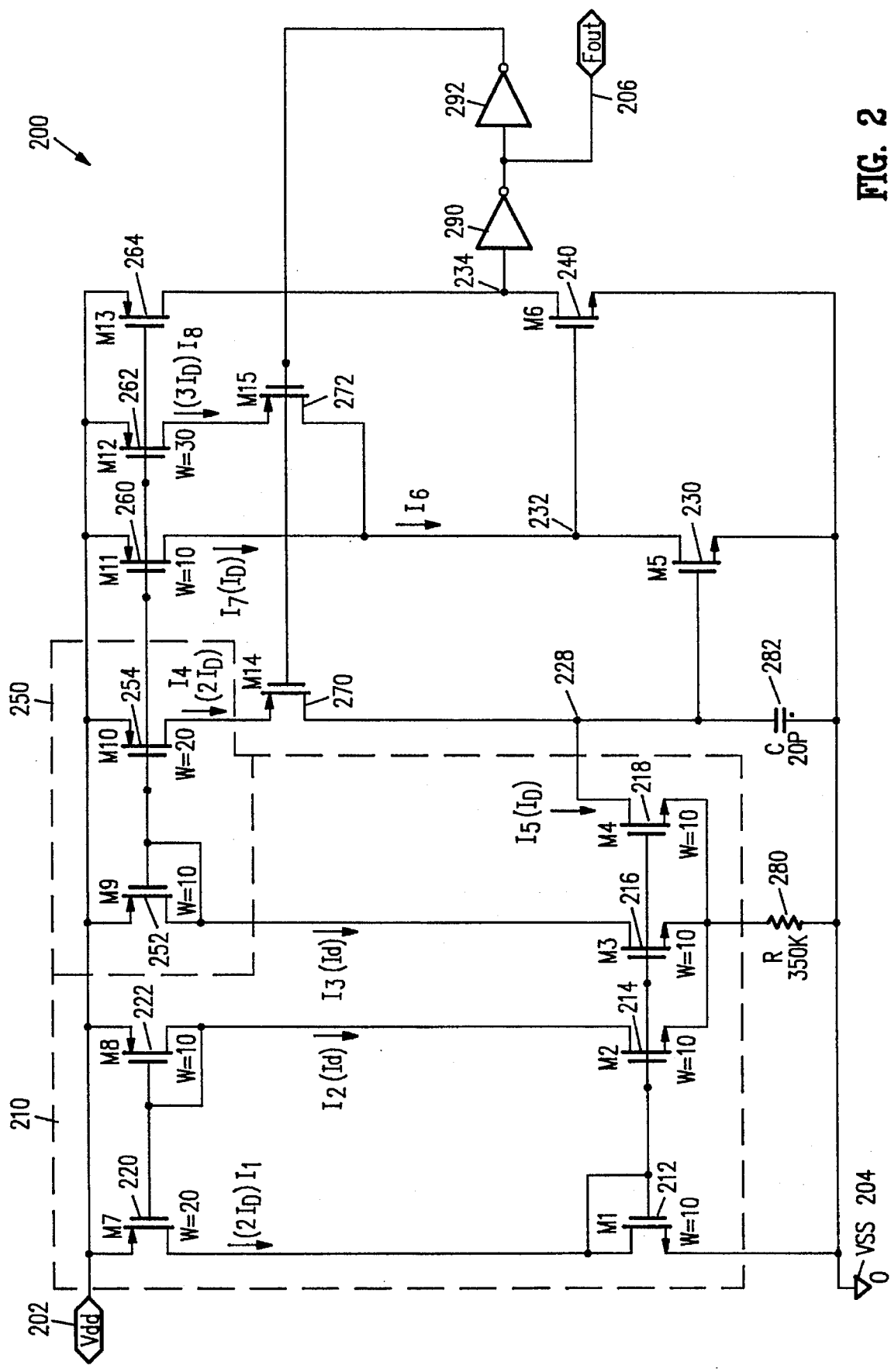
FIG. 2 is a schematic circuit diagram which illustrates the RC oscillator of the present invention.

Referring to FIG. 2, a micropower RC oscillator 200 includes several metal-oxide semiconductor field effect transistors (MOSFETs) which operate in weak inversion (subthreshold), thereby substantially limiting the supply current during operation. The transistors are arranged into functional units including a current reference 210, a hysteresis controller MOSFET M5 230, a feedback driver 240, a current mirror 250, current source MOSFETs M11 260, M12 262, M13 264 and switch MOSFETs M14 270 and M15 272.

The current reference 210 is formed by four N-channel MOSFETs M1 212, M2 214, M3 216 and M4 218 and two P-channel MOSFETs M7 220 and M8 222. P-channel MOSFET M7 220 has a source terminal connected to a VDD power supply terminal 202 and a drain terminal which supplies a drain current $I_1$. P-channel MOSFET M8 222 has a source terminal connected to the VDD power supply terminal 202, and a gate terminal and a drain terminal which are interconnected and connected to the gate terminal of P-channel MOSFET M7 220. The drain terminal of P-channel MOSFET M8 222 conducts a drain current $I_2$. N-channel MOSFET M1 212 has a source terminal connected to a VSS ground reference terminal 204, and a gate terminal and a drain terminal which are interconnected and connected to the drain terminal of P-channel MOSFET M7 220 so that the drain current $I_1$ conducts through the source to drain pathway of N-channel MOSFET M1 212. N-channel MOSFET M2 214 has a source terminal connected to a resistor R 280, a gate terminal which is connected to the gate terminal of N-channel MOSFET M1 212 and a drain terminal which is connected to the drain terminal of P-channel MOSFET M8 222 so that the drain current $I_2$ conducts through the source to drain pathway of N-channel MOSFET M2 214. N-channel MOSFET M3 216 has a source terminal connected to the resistor R 280, a gate terminal which is connected to the gate terminals of N-channel MOSFETs M1 212 and M2 214 and a drain terminal. N-channel MOSFET M4 218 has a source terminal connected to the resistor R 280, a gate terminal which is connected to the gate terminals of N-channel MOSFETs M1 212, M2 214 and M3 216 and a drain terminal connected to a capacitor C 282 at a node 228. The resistor R 280 is also connected at an end opposite the MOSFETS M1 212, M2 214, M3 216 and M4 218 to a VSS ground reference terminal 204. The capacitor C 282 is also connected at an end opposite the drain terminal of MOSFET M4 218 to the VSS ground reference terminal 204. The MOSFETs operate in weak inversion so that the drain currents $I_D$ and gate voltages of the MOSFETs are exponentially related as follows:

$$I_D = (V_t/3R)\ln(2),$$

where $V_t$ is equal to $kT/q$. The drain current $I_2$ of P-channel MOSFET M8 222 is equal to the drain current $I_D$. Gate widths of P-channel MOSFETs M7 220 and M8 222 are sized so that the drain current $I_1$ of P-channel MOSFET M7 220 is twice the drain current $I_2$ ($I_D$).

A drain current $I_3$, which is also equal to the drain current $I_D$, is mirrored by the current mirror 250. The current mirror 250 includes P-channel MOSFETs M9 252 and M10 254. P-channel MOSFET M9 252 has a source terminal connected to the VDD power supply terminal 202, and a gate terminal and a drain terminal which are interconnected and connected to the drain of N-channel MOSFET M3 216 of the current reference 210. P-channel MOSFET M10 254 has a source terminal connected to the VDD power supply terminal 202, a gate terminal connected to the gate terminal of P-channel MOSFET M9 252 and a drain terminal. The drain current $I_3$ from the current reference 210 is mirrored by the P-channel MOSFETs M9 252 and M10 254 so that the drain current $I_4$ of P-channel MOSFET M10 254 has a magnitude that is twice the drain current $I_3$, and therefore is substantially equal to $2I_D$.

Switch MOSFET M14 270, a P-channel MOSFET, has a source-drain connection between the current mirror 250 and the current reference 210. In particular, the switch MOSFET M14 270 has a source terminal connected to the drain terminal of P-channel MOSFET M10 254 and a drain terminal connected to the drain terminal of N-channel MOSFET M4 218 at node 228. The gate widths of P-channel MOSFETs M9 252 and M10 254 and N-channel MOSFETs M3 216 and M4 218 are sized so that the drain current $I_4$ ($2I_D$) of P-channel MOSFET M10 254 is twice the drain current $I_5$ ($I_D$) of N-channel MOSFET M4 218. Switch MOSFET M14 270 operates as a switch in series with the drain of P-channel MOSFET M10 254. The switch MOSFET M14 270 is controlled by the output signal on line Fout 206, which is connected through an inverter 292 to the gate terminal of switch MOSFET M14 270.

Current source MOS FETs M11 260 and M12 262 are connected in parallel to generate a drain current $I_6$ applied to hysteresis controller MOSFET M5 230. MOSFET M11 260 is a P-channel MOSFET with a source terminal connected to VDD power supply terminal 202, a drain terminal and a gate terminal connected to the gate terminals of P-channel MOSFETs M9 252 and M10 254. MOSFET M12 262 is a P-channel MOSFET with a source terminal connected to VDD power supply terminal 202, a drain terminal and a gate terminal connected to the gate terminals of P-channel MOSFETs M9 252, M10 254 and M11 260. Switch MOSFET M15 272, a P-channel MOSFET, alternatively connects and disconnects the drain terminal of MOSFET M12 262 to the drain terminal of MOSFET M11 260. Switch MOSFET M15 272 has a source terminal connected to the drain terminal of current source MOSFET M12 262, a drain terminal connected to the drain terminal of MOSFET M11 260 and a gate terminal connected to an output terminal of inverter 292 so that switch MOSFETs M14 270 and M15 272 are controlled by the same signal. The drain current $I_D$ is mirrored to the current source MOSFETs M11 260 and M12 262 by the current mirror 250. The gate widths of P-channel MOSFETs M11 260 and M12 262 and the P-channel MOSFETs in the current mirror 250 are sized so that a drain current $I_8$ at the drain terminal of P-channel MOSFET M12 262 is three times the drain current $I_D$, which is the drain current $I_7$ conducted at the drain terminal of P-channel MOSFET M11 260.

The current source MOSFETs M11 260 and M12 262, in combination, generate the drain current $I_6$ applied to the hysteresis controller MOSFET M5 230. The hysteresis controller MOSFET M5 230 is an N-channel MOSFET having a source terminal connected to the VSS ground reference terminal 204, a drain terminal connected at a node 232 to the drain terminals of current source MOSFET M11 260 and switch MOSFET M15 272, and a gate terminal connected to node 228. Accordingly, the drain current $I_6$ of hysteresis controller MOSFET M5 230 is supplied by current source MOSFET M11 260 ($I_7$) at a magnitude of $I_D$ and by switched current source MOSFET M12 262 ($I_8$) at a magnitude of $3I_D$.

Current source MOSFET M13 264 is a P-channel MOSFET having a source terminal connected to VDD power supply terminal 202, a drain terminal, and a gate terminal connected to the gate terminals of P-channel MOSFETs M9 252, M10 254, M11 260 and M12 262. Feedback driver 240 is an N-channel MOSFET M6 having a source terminal connected to the VSS ground reference terminal 204, a drain connected to the drain of current source MOSFET M13 264 at a node 234 and a gate terminal connected to node 232. The drain terminal of feedback driver 240 drives an output signal to output line Fout 206 through an inverter 290. A second inverter 292 has an input terminal connected to the output terminal of the first inverter 290 which inverts the output signal for application to the gate terminals of switch MOSFETs M14 270 and M15 272. The switch MOSFET M14 270 is controlled by the output signal on line Fout 206, which is connected through an inverter 292 to the gate terminal of switch MOSFET M14 270.

When the output signal on line Fout 206 is low (logic 0), the gate of switch MOSFET M14 270 is high (logic 1), and the switch MOSFET M14 270 is deactivated. In this condition, N-channel MOSFET M4 218 conducts current $I_5$ ($I_D$) out of the capacitor C 282, causing the voltage at the gate of N-channel MOSFET M5 230 to ramp down at a rate of $I_D/C$ where C is the capacitance of capacitor C 282. In addition, switch MOSFET M15 272 is deactivated so that the current load to hysteresis controller MOSFET M5 230 is $I_D$.

When the output signal on line Fout 206 is high (logic 1), the switch MOSFET M14 270 is activated so that the drain current $I_4$ ($2I_D$) flows to a node 228 between the drain terminal of N-channel MOSFET M4 218 and capacitor C 282, so that the voltage at the gate terminal of hysteresis controller MOSFET M5 230 ramps up at a rate of $I_D/C$. Furthermore, switch MOSFET M15 272 is activated so that the current load to hysteresis controller MOSFET M5 230 ($I_6$) is substantially equal to the sum of the drain currents of P-channel MOSFETs M11 260 and M12 262 ($I_7+I_8$). The sum of the drain currents $I_7$ and $I_8$ is a current having a magnitude of about $4I_D$. The gate voltage of hysteresis controller MOSFET M5 230 that is needed to conduct the drain current varies according to the magnitude of the drain current. Specifically, the difference in gate voltage of hysteresis controller MOSFET M5 230 to conduct a current magnitude of $4I_D$ relative to the gate voltage to conduct a current magnitude of $I_D$ is, as follows:

$$V_G(4I_D)-V_G(I_D)=(nVt)\ln(4),$$

where n is a fabrication process-specific parameter.

The RC oscillator 200 operates at very low currents, in weak inversion or subthreshold, so that the voltage threshold $V_T$ varies logarithmically with respect to drain current $I_D$. Also the currents that are used to charge and discharge the MOSFET M5 230 and the capacitor C 282 are logarithmic. Accordingly, the final output frequency, which varies both as a function of the current and the voltage threshold, does not change in a logarithmic manner, but instead is substantially linear and depends almost exclusively on the resistance value R of the resistor R 280 and the capacitance value C of the capacitor C 282. Advantageously, the temperature coefficient of the oscillator depends on the temperature coefficient of the resistor and the temperature coefficient of the capacitor and is only weakly dependent on the process-sensitive parameter n.

Figure 3:
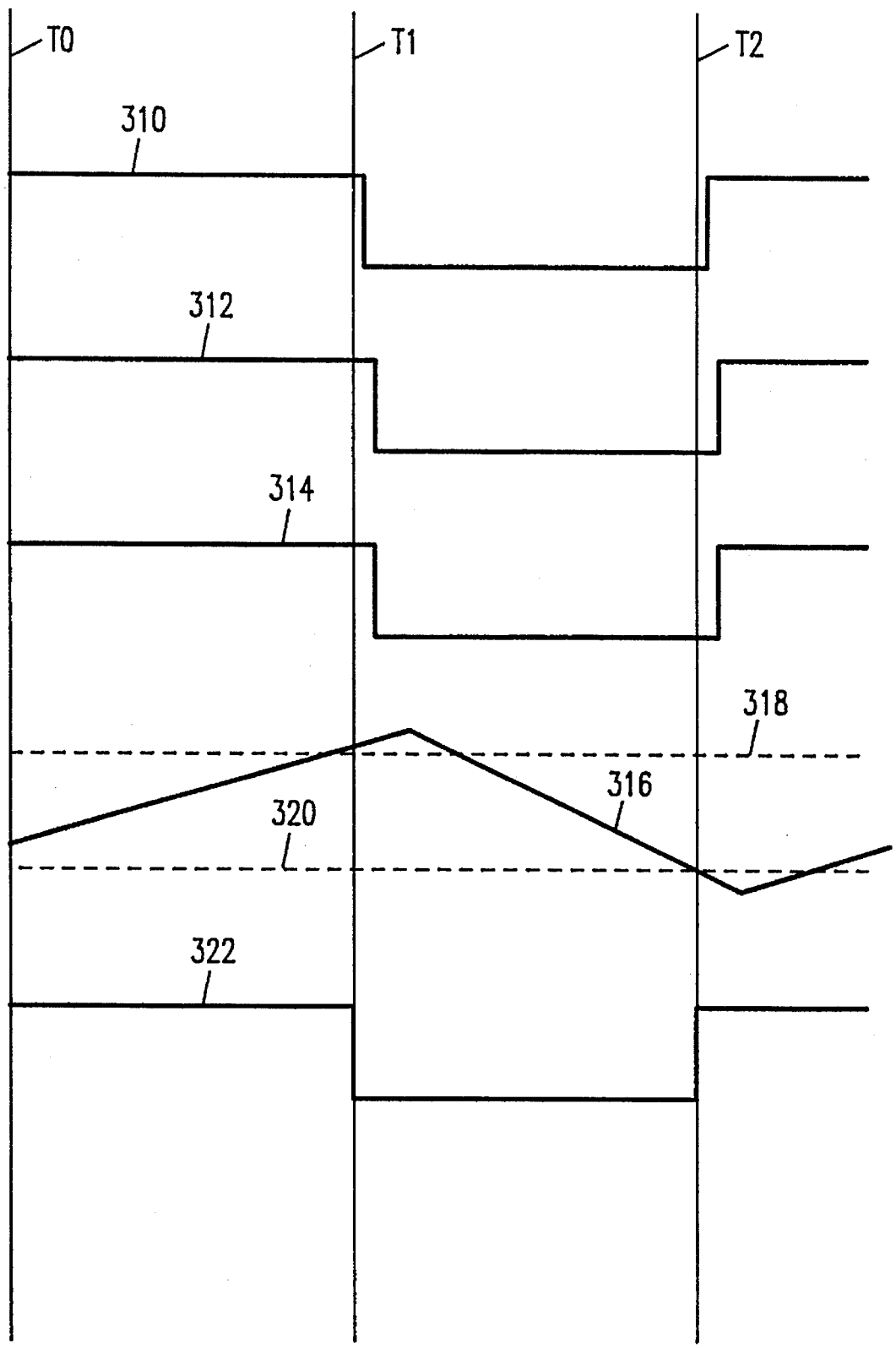
FIG. 3 is a timing diagram which illustrates dynamic operation of the RC oscillator shown in FIG. 2.

Referring to the timing diagram shown in FIG. 3 and the circuit diagram shown in FIG. 2, dynamic operation of the RC oscillator 200 is described. A starting condition at time T0 manifests an initial high condition of the output signal 310 on line Fout 206. Switch MOSFETs M14 270 and M15 272 are activated so that current $I_4$ 312 with a magnitude of $2I_D$ is conducting to node 228 and current $I_6$ 314 with a magnitude of $4I_D$ is conducting to node 232. The voltage $V_{GMS}$ 316 at the gate of hysteresis controller MOSFET M5 230 ramps up at a rate of $I_D/C$. In this condition a voltage $V_{DMS}$ 320 on the drain terminal of hysteresis controller MOSFET M5 230 is high.

At time T1, the voltage $V_{GMS}$ 316 at the gate of hysteresis controller MOSFET M5 230 increases enough to reach a threshold voltage $V_{T(4Id)}$ 318 that is sufficient for the MOSFET M5 230 to conduct a current of $4I_D$. When the hysteresis controller MOSFET M5 230 becomes conductive, the voltage $V_{DMS}$ 320 on the drain terminal of hysteresis controller MOSFET M5 230 transitions to a low logic state, deactivating switch MOSFETs M14 270 and M15 272 so that current $I_4$ 312 is cut off to node 228 and reducing the current $I_6$ 314 to node 232 to a magnitude of $I_D$. Because the load current of switch MOSFET M14 270 is turned off, the voltage $V_{GMS}$ 316 at the gate of hysteresis controller MOSFET M5 230 ramps down at a rate of $I_D/C$. At time T2, the voltage $V_{GMS}$ 316 at the gate of hysteresis controller MOSFET M5 230 ramps down by an amount (nVt)(ln4), causing the voltage $V_{DMS}$ 320 on the drain terminal of hysteresis controller MOSFET M5 230 and the output signal on line Fout 206 to go high again, thereby reactivating switch MOSFETs M14 270 and M15 272. In this manner, the RC oscillator 200 continuously charges and discharges the capacitor C 282 from the P-channel MOSFET M10 254 in current mirror 250.

The frequency of oscillation of the RC oscillator 200 is the reciprocal of the ramp-up time plus the ramp-down time. The ramp rates are substantially equal and opposite in direction. The ramping time (either up or down) is calculated from the voltage excursion (nVt)ln(4) divided by the ramp rate $I_D/C$, as follows:

$$\text{rampingtime}=C(nVt)\ln(4)/I_D.$$

Substituting (Vt/3R)ln(2) for $I_D$ produces an equation of:

$$\text{rampingtime}=3RC(nVt)\ln(4)/(Vt)\ln(2)=6nRC.$$

Solving for frequency, $$\text{freq}=\frac{1}{12nRC}$$

Thus the output frequency is very weakly dependent on process and temperature variations which modify the process parameter n. Furthermore, the output frequency varies inversely with the capacitance C and the resistance R of the R and C elements of the RC oscillator circuit 200. In one example, nominal values of resistance of 350KΩ and capacitance C of 20 pF yield a frequency of oscillation of 8 kHz. Advantageously, the RC oscillator 200 operates with a supply current significantly lower than 1µA. Also advantageously, the RC oscillator 200 has a fast feedback loop which avoids circuit delays inherent in conventional micropower RC oscillators.

The description of certain embodiments of this invention is intended to be illustrative and not limiting. Numerous other embodiments will be apparent to those skilled in the art, all of which are included within the broad scope of this invention. For example, the described embodiments of an RC oscillator utilize an integrated resistor and an integrated capacitor. In other embodiments, external (off-chip) resistors and capacitors may be used.

What is claimed is:

1. An RC oscillator comprising:

an RC circuit including a resistor and a capacitor;

a capacitor charging and discharging circuit coupled to the capacitor;

a transistor coupled to the capacitor for sensing the capacitor voltage; and a hysteresis circuit coupled to the transistor for receiving a signal indicative of the sensed capacitor voltage and for generating a control signal controlling a threshold voltage of the transistor and coupled to the capacitor charging and discharging circuit for controlling charging and discharging of the capacitor.

2. An oscillator according to claim 1 wherein the control signal for controlling the transistor threshold voltage is a signal controlling the drain current of the transistor.

3. An RC oscillator comprising:

a resistor;

a capacitor coupled to the resistor;

a biasing circuit coupled to the resistor and coupled to the capacitor for supplying a current for charging the capacitor;

a transistor having a control terminal coupled to the capacitor and an output terminal;

a hysteresis circuit having an input terminal coupled to the transistor output terminal, a first output control signal generating a signal for controlling charging of the capacitor and a second output control signal generating a signal for controlling a threshold voltage of the transistor.

4. An oscillator according to claim 3, wherein the biasing circuit further comprises:

a current reference circuit coupled to the resistor and the capacitor; and a current mirror coupled to the current reference circuit and coupled to the capacitor, the current mirror supplying a current for charging the capacitor.

5. An oscillator according to claim 4, wherein the current reference circuit further comprises:

a first P-channel MOSFET having a source terminal coupled to a power supply line, a drain terminal and a gate terminal;

a second P-channel MOSFET having a source terminal coupled to the power supply line, and a drain terminal and a gate terminal which are intercoupled and coupled to the gate terminal of the first P channel MOSFET;

a first N-channel MOSFET having a source terminal coupled to a ground reference line, and a drain terminal and a gate terminal which are intercoupled and coupled to the drain terminal of the first P-channel MOSFET;

a second N-channel MOSFET having a source terminal coupled to the resistor, a drain terminal coupled to the drain terminal of the second P-channel MOSFET and a gate terminal coupled to the gate terminal of the first N-channel MOSFET;

a third N-channel MOSFET having a source terminal coupled to the resistor, a drain terminal and a gate terminal coupled to the gate terminals of the first and second N-channel MOSFETs; and a fourth N-channel MOSFET having a source terminal coupled to the resistor, a drain terminal coupled to the capacitor and to a gate terminal of the transistor and a gate terminal coupled to the gate terminals of the first and second N-channel MOSFETs.

6. An oscillator according to claim 5, wherein the current mirror further comprises:

a first current mirror P-channel MOSFET having a source terminal coupled to the power supply line, and a drain terminal and a gate terminal which are intercoupled and coupled to the drain terminal of the third N-channel MOSFET; and a second current mirror P-channel MOSFET having a source terminal coupled to the power supply line, a drain terminal and a gate terminal coupled to the gate terminal of the first current mirror P channel MOSFET.

7. An oscillator according to claim 6, wherein the transistor has a current flowpath and the hysteresis circuit further comprises:

a plurality of current sources coupled to the transistor current flowpath; and a control circuit having an input terminal coupled to the transistor output terminal, a first control output signal coupled to the current mirror for controlling a current to the capacitor, and a second control output signal coupled to the plurality of current sources for controlling a current to the transistor current flowpath.

8. An oscillator according to claim 7, wherein the plurality of current sources further comprises:

a first current source P-channel MOSFET having a source terminal coupled to the power supply line, a drain terminal coupled to a drain terminal of the transistor and a gate terminal coupled to the gate terminals of the first and second current mirror P-channel MOSFETs;

a second current source P-channel MOSFET having a source terminal coupled to the power supply line, a drain terminal coupled to the control circuit and a gate terminal coupled to the gate terminals of the first and second current mirror P-channel MOSFETs; and a third current source P-channel MOSFET having a source terminal coupled to the power supply line, a drain terminal and a gate terminal coupled to the gate terminals of the first and second current mirror P-channel MOSFETs.

9. An oscillator according to claim 8, wherein the control circuit further comprises:

an N-channel driver MOSFET having a source terminal coupled to the ground reference line, a drain terminal coupled to the drain terminal of the third current source P-channel MOSFET and a gate coupled to the drain terminal of the transistor;

a first switch P-channel MOSFET having a source terminal coupled to the drain terminal of the second current mirror P-channel MOSFET, a drain terminal coupled to the drain terminal of the fourth N-channel MOSFET and a gate terminal coupled to the drain terminal of the N-channel driver MOSFET; and a second switch P-channel MOSFET having a source terminal coupled to the drain terminal of the second current source P-channel MOSFET, a drain terminal coupled to the drain terminal of the first current source P-channel MOSFET and a gate terminal coupled to the drain terminal of the N-channel driver MOSFET.

10. An oscillator according to claim 4, wherein the transistor has a current flowpath and the hysteresis circuit further comprises:

a plurality of current sources coupled to the transistor current flowpath; and a control circuit having an input terminal coupled to the transistor output terminal, a first control output signal coupled to the current mirror for controlling a current to the capacitor, and a second control output signal coupled to the plurality of current sources for controlling a current to the transistor current flowpath.

11. An oscillator according to claim 3 wherein the transistor is an N-channel MOSFET.

12. A method of operating an RC oscillator including a resistor and a capacitor comprising the steps of:

alternately charging and discharging the capacitor;

sensing the capacitor voltage using a transistor coupled to the capacitor;

controlling a threshold voltage of the transistor as a function of the sensed capacitor voltage; and controlling the charging and discharging of the capacitor as a function of the sensed capacitor voltage.

13. A method according to claim 12 wherein the step of controlling the transistor threshold voltage comprises the step of:

controlling a drain current applied to a drain terminal of the transistor.

14. A method according to claim 12 wherein the step of controlling the charging and discharging of the capacitor comprises the step of:

controlling a drain current applied to the capacitor.

15. A method according to claim 12 further comprising the step of:

operating the RC oscillator in a subthreshold condition.

* * * * *